United States Patent
Kersch et al.

(10) Patent No.: US 6,458,603 B1
(45) Date of Patent: Oct. 1, 2002

(54) METHOD OF FABRICATING A MICRO-TECHNICAL STRUCTURE, AND MICRO-TECHNICAL COMPONENT

(75) Inventors: Alfred Kersch, Putzbrunn; Siegfried Schwarzl, Neubiberg; Stefan Miethaner, Regensburg; Hermann Wendt, Grasbrunn, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/974,938

(22) Filed: Oct. 10, 2001

(30) Foreign Application Priority Data

Oct. 10, 2000 (DE) ........................... 100 50 076.5

(51) Int. Cl.$^7$ ................................. H01L 21/00
(52) U.S. Cl. ..................... 438/3; 438/48; 438/104
(58) Field of Search ................. 438/3, 48, 104, 438/179, 286; 257/295, 310, 9; 428/694, 432, 469, 472, 702; 365/173, 171

(56) References Cited

U.S. PATENT DOCUMENTS

| | | | | |
|---|---|---|---|---|
| 5,390,061 A | * | 2/1995 | Nakatani et al. | 360/113 |
| 5,650,958 A | * | 7/1997 | Gallagher et al. | 365/173 |
| 5,729,410 A | * | 3/1998 | Fontana, Jr. et al. | 360/113 |
| 5,764,567 A | * | 6/1998 | Parkin | 365/173 |
| 5,804,458 A | | 9/1998 | Tehrani et al. | |
| 6,048,739 A | | 4/2000 | Hurst et al. | |
| 6,128,214 A | * | 10/2000 | Kuekes et al. | 365/151 |
| 6,174,737 B1 | * | 1/2001 | Durlam et al. | 438/3 |
| 6,226,160 B1 | * | 5/2001 | Gallagher et al. | 360/324.2 |
| 6,312,816 B1 | * | 11/2001 | Roeder et al. | 428/432 |
| 6,316,797 B1 | * | 11/2001 | Van Buskirk et al. | 257/295 |
| 6,323,512 B1 | * | 11/2001 | Noh et al. | 257/295 |
| 6,326,637 B1 | * | 12/2001 | Parkin et al. | 257/9 |
| 6,368,878 B1 | * | 4/2002 | Abraham et al. | 438/3 |

FOREIGN PATENT DOCUMENTS

| | | |
|---|---|---|
| DE | 25 40 300 C3 | 4/1976 |
| DE | 196 22 415 A1 | 12/1997 |
| EP | 0 936 624 A2 | 8/1999 |
| WO | WO 00/52701 | 9/2000 |

OTHER PUBLICATIONS

Dunkleberger, L.N.: "Stencil technique for the preparation of thin–film Josephson devices", J. Vac. Sci. Technol., vol. 15, No. 1, Jan./Feb. 1978, pp. 88–90.

Pearton, S.J. et al.: "High Rate Etching Of Metals For Magnetoelectronic Applications", Electrochemical Society Proceedings, vol. 97–21, pp. 270–285.

Jung, K.B. et al.: "$Cl_2$–based Inductively Coupled Plasma Etching of NiFe and Related Materials", J. Electrochem. Soc., vol. 145, No. 11, Nov. 1998, pp. 4025–4028.

Jung, K.B. et al.: "Relative merits of $Cl_2$ and $CO.NH_3$ plasma chemistries for dry etching of magnetic random access memory device elements", Journal of Applied Physics, vol. 85, No. 8, Apr. 15, 1999, pp. 4788–4790.

Kim, S.D. et al.: "Assessment of dry etching damage in permalloy thin films", Journal of Applied Physics, vol. 85, No. 8, Apr. 15, 1999, pp. 5992–5994.

* cited by examiner

Primary Examiner—Olik Chaudhuri
Assistant Examiner—Laura Schillinger
(74) Attorney, Agent, or Firm—Laurence A. Greenberg; Werner H. Stemer; Gregory L. Mayback

(57) ABSTRACT

The invention relates to a method for fabricating in particular a TMR element for use in a MRAM, wherein a mask is arranged on a substrate and structured in such a manner that it shadows but does not cover a surface region of the substrate, and wherein material of the structure which is to be fabricated is then deposited on the substrate in a directed deposition process. The invention also relates to a component with a micro-technical structure which has been fabricated in this manner.

9 Claims, 4 Drawing Sheets

METHOD OF FABRICATING A MICRO-TECHNICAL STRUCTURE, AND MICRO-TECHNICAL COMPONENT

BACKGROUND OF THE INVENTION

FIELD OF THE INVENTION

The invention relates to a method for fabricating a micro-technical structure, in particular a ferromagnetic structure for use in a MRAM (Magneto-resistive Random Access Memory), wherein a mask is structured, the mask is arranged on a substrate and the micro-technical structure is generated on a surface region of the substrate which is not covered by the mask. The invention also relates to a micro-technical component having a substrate and a micro-technical structure arranged on the substrate.

Particularly in the case of microelectronic components, i.e. electronic components whose structure dimensions reach the micron range and even the sub-micron range, special, highly developed structuring processes are employed. Structures with particularly small dimensions are desired in particular for the development of data memories. However, structuring processes of this type are also employed for microstructures for other applications, such as for example write and/or read heads for hard disks.

It is known to use lithography processes and etching processes to structure thin layers and layer systems. In particular, in this case the lithography processes generate structures in photo resist layers, and etching processes transfer these structures into the thin layers or layer systems which lie below the photo resist layers. Anisotropic plasma etching processes, such as for example RIE (Reactive Ion Etching), RSE (Reactive Sputter Etching), ECR etching (Electron Cyclotron Resonance etching), ICP etching (Inductively Coupled Plasma etching) and CAIBE (Chemically Assisted Ion Beam Etching) are known for layer structuring in the micron ($\mu$m) and sub-micron (sub-$\mu$) range. With etching processes of this type, it is necessary for the reaction products formed from the material which is to be etched away to pass into the gas phase so that they can be removed from the reaction chamber. Numerous materials which are suitable for microstructures in terms of their physical properties cannot be satisfactorily structured using some or all of the known etching processes, since the reaction products which are formed during the etching form a passivating layer on the surface of the material which is to be etched, thus preventing further etching and removal of the material. Furthermore, etching processes in general may lead to redeposition of the material which has been etched off, for example on etching masks, the edges of the regions which are to be etched and on parts of the etching chamber. This leads, for example, to undesirable inclined etching flanks and changes to the dimensions of etching masks. However, electrical short circuits caused by electrically conductive redeposition on the flanks of multilayer systems may also occur.

Particularly for use in future MRAMs (Magneto resistive Random Access Memories), structures with ferromagnetic materials, such as Ni, Fe and Co, as well as alloys comprising these materials, are produced and tested for suitability. When structuring these materials using etching processes, the nonvolatile passivating layers described above are formed. S. J. Pearton, et al., in the publication "High Rate Etching of Metals for Magneto Electronic Applications," Electrochemical Society Proceedings Vol. 97-21, pages 270–85 (hereinafter "Pearton") propose using a plasma etching process with a high ion density, in order to avoid the formation of a disruptive passivating layer. According to Pearton, the high ion density leads to a high ion flux, so that normally nonvolatile reaction products are sputtered away. Pearton proposes etching ferromagnetic metal alloys, such as NiFe and NiFeCo, in the presence of Cl in the etching gas. Although this leads to higher etching rates than with pure Ar etching gas, chlorine-containing compounds that are thereby formed lead to corrosion of the metal alloys after the etching. The chlorine-containing compounds have to be removed in a further process step.

It is reported in the publication "Assessment of Dry Etching Damage in Permalloy Thin Films" by S. D. Kim et al., Journal of Applied Physics, Vol. 85, No. 8, pages 5992–5994, dated Apr. 15, 1999, that plasma dry etching processes, such as IBE (Ion Beam Etching) and RIE (Reactive Ion Etching), in the case of NiFe (Permalloy), lead to the magnetic properties being impaired, on account of the bombardment with ions.

A further drawback of plasma etching techniques is the low selectivity of the etching action both with respect to the etching mask and with respect to the substrate on which the material to be etched is arranged. This leads to etching masks being worn away and to undesirable structuring of the substrate.

SUMMARY OF THE INVENTION

It is accordingly an object of the invention to provide a method of fabricating a micro-technical structure and a micro-technical component with a micro-technical structure formed on a substrate, which overcomes the above-mentioned disadvantages of the heretofore-known devices and methods of this general type and wherein the generation of the final lateral dimensions of the structure (structuring) effects and/or causes and/or has caused as far as possible no damage to the structure and the substrate. Particularly in the case of structures comprising ferromagnetic materials, the magnetic properties of these materials are not to be adversely affected by the structuring and subsequent process steps caused by the structuring.

With the foregoing and other objects in view there is provided, in accordance with the invention, a method of fabricating a micro-technical structure, in particular a ferromagnetic structure for an MRAM. The method comprises the following steps:

providing a substrate;
forming a structured shadow mask on the surface of the substrate, and defining on the surface an uncovered surface region not covered by the mask and a shadow region shadowed but not covered by the mask; and
depositing material through the mask in a directed deposition process and forming the micro-technical structure on the uncovered surface region of the substrate not covered by the mask.

With the above and other objects in view there is also provided a micro-technical component, comprising:

a substrate; and
a micro-technical structure formed on the substrate and extending along a common interface with the substrate, the micro-technical structure having been fabricated with the above-outlined method, and a shaping of a surface or at least one layer of the structure at an edge of the structure resulting only from a deposition of the structure material in the directed deposition process.

An important idea of the present invention is to arrange the material of the structure on the substrate in the same process step as at least part of the structuring of the structure which is to be fabricated. The structure is laterally delimited in at least one location of the substrate purely by the fact that the structure material is arranged on the substrate. This eliminates the need for a following etching process, which could cause damage to the structure and/or the substrate.

In one embodiment, a mask is structured and arranged on the substrate in such a manner that the mask shadows but does not cover a surface region of the substrate. In the direction of a surface normal, the mask is situated at a distance from the surface in this surface region. Then, material of the structure which is to be fabricated is deposited on the substrate in a directed deposition process. The term "directed deposition process" is understood as meaning a deposition process wherein the material which is to be deposited generally moves in a directed manner, namely in a straight line, toward the deposition location. This does not rule out the possibility of the direction of movement of the material which is to be deposited being changed, for example by the interaction of a plurality of particles of the material being deposited and/or deflection from structure edges and/or by scattering on fixed structures. However, most of the material which is to be deposited will move substantially in a straight line from a deposition source or a source region of the deposition to the deposition location.

A significant advantage of this embodiment consists in the fact that significantly less material is deposited on the shadowed surface region of the substrate than on uncovered and unshadowed surface regions of the substrate. Furthermore, even within the shadowed region the deposition rate is dependent on the distance between the deposition location and the edge of the shadowed region. Generally, the deposition rate will fall continuously at increasing distance from the edge of the shadowed region. The dimensioning of the mask and setting of the distance between the mask and the shadowed surface region of the substrate, as well as the nature and process management of the directed deposition process, therefore allows the local distribution of the thickness of the deposited material in the shadowed region to be controlled. It is therefore possible, for example, to produce a more or less steep flank of the deposited material at the edge of the shadowed region.

In a special embodiment of the invention, wherein, by deposition of a plurality of layers on top of one another on the substrate, the in this case multilayer micro-technical structure is generated, the control options referred to above can be utilized to good effect. For example, it is possible for a layer which is deposited at a later stage to completely cover a layer which was deposited at an earlier stage all the way over the edge of the layer which was deposited earlier. The layer deposited later is, for example, a tunnel barrier, a diffusion barrier and/or a separating layer which prevents the material of the layer deposited earlier from coming into contact with material of a layer which was deposited even later than the separating layer. In particular, a TMR (Tunnel Magneto resistance) element or a GMR (Giant Magneto resistance) element can be produced in this way. TMR and GMR elements can be used, for example, as memory elements for future MRAMs.

In particular, the layer which was applied later and the layer which was applied earlier are produced, in deposition processes, with a different angular distribution of the material which is to be deposited. In this context, the term angular distribution is understood as meaning the angular distribution of the material to be deposited from the viewpoint of a source of the deposition process or a source region of the deposition source. Sources of the deposition process may, for example, be a sputtering target, an electrically heatable evaporation source and/or the target of an electron beam evaporator. The angular distribution can be set in particular by ionization of the material to be deposited and by means of electrical fields. Pure PVD (Physical Vapor Deposition) processes have a more uniform angular distribution than PVD processes with ionized deposition material in the presence of electric field forces. In the case of electron processes, the flux of deposition particles in the direction of the electric field forces is greater.

The mask which shadows the surface region of the substrate may be structured before, during and/or after its application to the substrate. It is advantageously arranged and structured in such a manner that a first part of the mask covers a surface region of the substrate and a second part of the mask forms an overhang which is supported against the substrate by the first part and which defines the shadowed surface region. The length of the overhang is preferably adapted to the abovementioned factors of influence for controlling the deposition of the structure material in such a manner that the edge of the structure generated does not abut the mask. In this case, in a following method step, filler material may be arranged between the mask and the edge, serving, for example, as electrical insulation or a diffusion barrier.

In accordance with a particularly preferred feature of the invention, when arranging the mask on the substrate initially a first mask layer is deposited on the substrate. Then, a second mask layer is deposited on the first mask layer. Therefore, in the region wherein the micro-technical structure is subsequently to be generated, the substrate is covered by two mask layers which lie on top of one another. To structure the mask, the second mask layer and the first mask layer are removed again in defined regions. The result is a surface region of the substrate which is neither covered nor shadowed and is therefore available for the deposition of the structure material. The first and second mask layers preferably comprise different materials. The process for removal of the first and second mask layers may be a single-stage or multistage process. Then, in an isotropic etching process, additional material of the first mask layer is removed between the second mask layer and the substrate. This results in the overhang which is formed by the second mask layer.

Often, there is a need for micro-technical structures which are intended to have a continuous encircling edge with a defined local arrangement. By way of example, microelectronic structures at a defined location are deposited directly on a material which is used for electrical connection to the microelectronic structure. If the structure is not arranged at precisely the correct position, the electrical contact is insufficient and short circuits may occur at a later stage. The above-described arrangement and structuring of the mask offers a reliable solution to this problem. The first and second mask layers can be opened up at precisely the correct location, for example by lithographic methods. The edges of the regions which have been opened up in this way substantially also define the edges of the structure which is subsequently to be fabricated. In particular, the shadowed surface region forms a continuous encircling edge around an unshadowed surface region of the substrate, which is to be provided with the micro-technical structure.

In order, for example, to electrically insulate the micro-technical structure and/or mechanically stabilize the structure, the shadowed surface region of the substrate and/or the surface of the micro-technical structure is preferably covered with a filler material after the micro-technical structure has been generated. Particularly with the above-described type of arrangement and structuring of the mask, it is possible for the entire region which has been opened up in the first and second mask layers to be filled with the filler material. A planar surface is then formed by removing part of the mask and part of the filler material. The planar surface then, for example, allows the deposition of further planar layers and therefore allows the generation of further structure elements in a manner known per se.

The micro-technical component according to the invention is wherein the structure, which extends along the common interface with the substrate, has been fabricated using the method according to the invention, and the shaping of the structure surface or of at least one layer of the structure at the edge of the structure is exclusively the result of the deposition of the structure material in the directed deposition process. Therefore, the surface of the edge of the structure or of the layer has no traces whatsoever of a subsequent structuring measure carried out after the end of the deposition of the structure material. In particular, it has no residues of chemicals and/or ions which are used in an etching process, and, as is typical for a deposition process, the surface profile is slightly irregular, i.e. the surface has the typical roughness. This can be established by X-ray structural analysis tests in a corresponding way to that described in the abovementioned publication by S. D. Kim et al.

Particularly if the micro-technical structure has been fabricated with a sufficiently long overhang of the shadow mask, the structure at its edge has a characteristic S-shaped surface. In this area, the thickness of the structure increases in an S-shape from approximately 0 to a mean value for the structure.

The structure is preferably enclosed by an adjoining filler material which is applied to the substrate.

A significant advantage of the invention is that there is no need for complex plasma etching processes to structure the micro-technical structure. To structure the shadow mask it is possible, for example, to use much simpler etching installations with proven etching processes which are used for damascene processes. Particularly in the case of microelectronic structures, these installations are already in use for fabrication of the electrical connection lines. On account of the in-situ structuring of the structure by targeted, locally restricted deposition of the structure material, damage to the structure and/or the substrate caused by structuring etching processes is avoided.

Other features which are considered as characteristic for the invention are set forth in the appended claims.

Although the invention is illustrated and described herein as embodied in a method for fabricating a micro-technical structure, and micro-technical component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
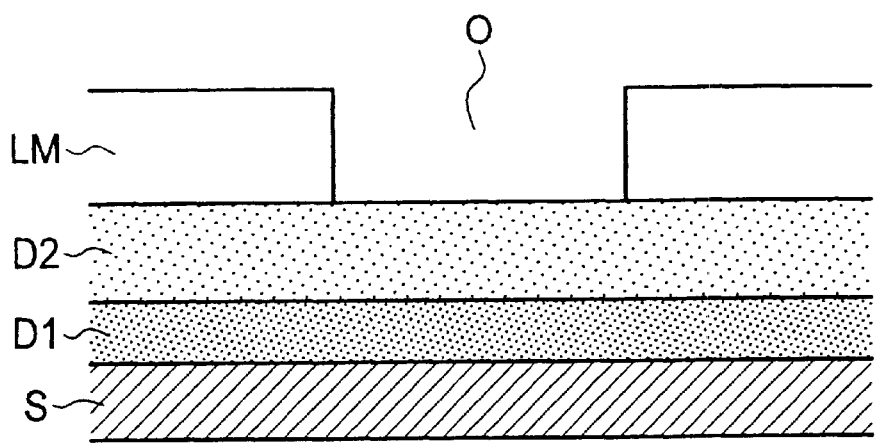
FIGS. 1–7 are diagrammatic side views illustrating various stages in the fabrication of a micro-technical structure.

Referring now to the figures of the drawing in detail and first, particularly, to FIG. 1 thereof, there is shown a cross section through a substrate S with layers arranged thereon. For the sake of simplicity, in the text which follows the terms "top" and "bottom" refer to the illustration which has been selected in FIGS. 1 to 11, without this being intended to restrict the implementation of the invention. The substrate S may, for example, be a CMOS, bipolar, BiCMOS or GaAs semiconductor circuit, including metallization structures. A first dielectric layer D1 comprising a first dielectric material is deposited on the substrate S. A second dielectric layer D2 made from a second dielectric material, which is different from the first dielectric material, is then deposited on the layer D1. A lithographically produced mask LM is in turn arranged on the layer D2. The mask LM has a hole-like aperture O which passes all the way through the mask layer.

Figure 2:
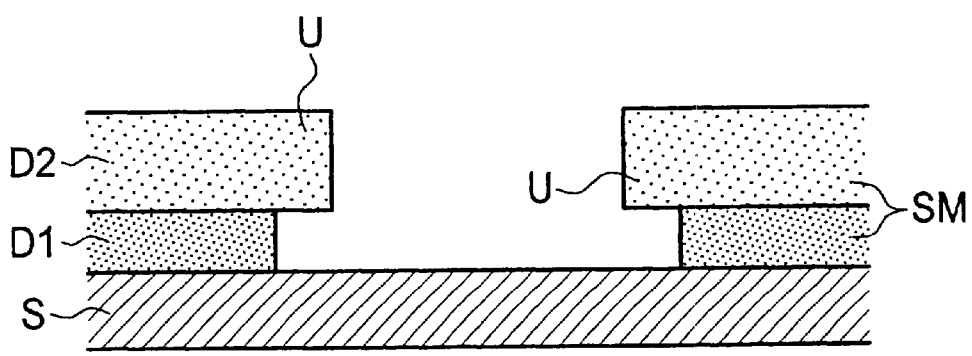

Starting from the structure illustrated in FIG. 1, in a following process step the opening O is transferred, with dimensions which are as closely accurate as possible, into the layer D2 using an anisotropic etching process, i.e. a continuous opening with, as far as possible, the same opening which is produced in layer D2. Then, in an isotropic etching process, the material of the layer D1 is etched, so that an opening with a greater width than the width of the opening in the layer D2 is formed in the layer D1. The isotropic etching process is a selective etching process wherein the material of the layer D2 and that of the substrate S are etched at most slightly. Then, the mask LM is removed. The resulting structure is illustrated in FIG. 2.

The layers D1, D2 which have been structured in this way form a shadow mask SM, the material of the layer D2, at the opening, forming a continuous, encircling overhang U; the length of the overhang U is equal to the difference between the radii of the circular openings in the layers D1, D2. Alternatively, the openings may also be rectangular or of some other shape.

Figure 3:
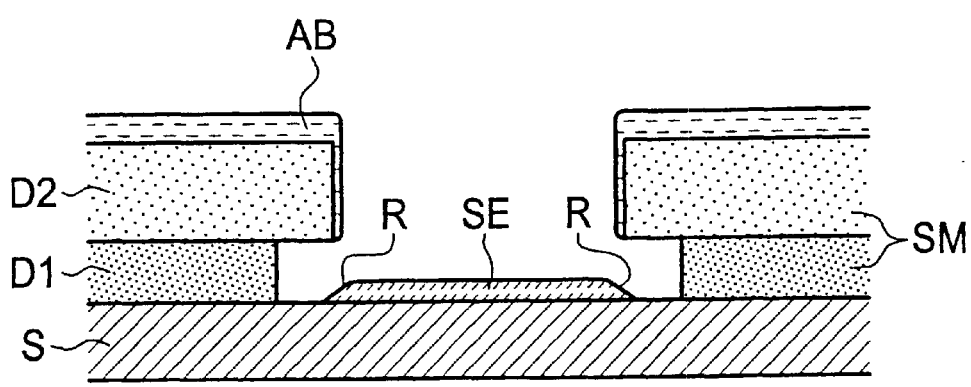
Figure 4:
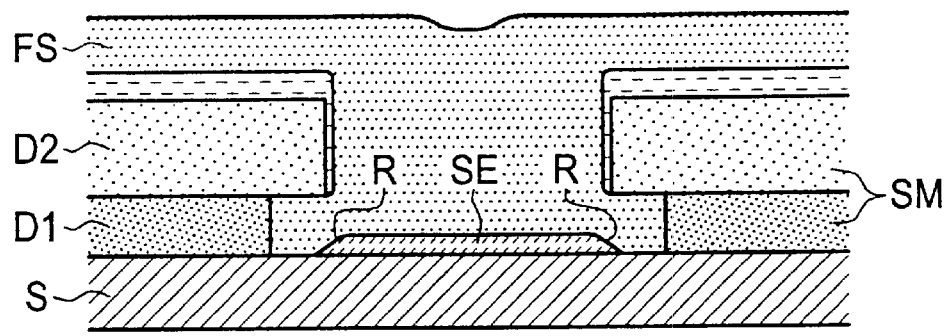

By directed deposition, e.g. by sputtering of the material to be deposited or by direct vaporization of the material to be deposited, a structure element SE is deposited on the surface of the substrate S (FIG. 3). Because part of the surface of the substrate S is shadowed by the overhang U, and because of the directionality of the deposition process, a flank or an edge R of the structure element SE is formed at the edge of the shadowed surface region. Since material is also deposited on the layer D2 during the deposition process, thereby reducing the width of the opening in layer D2, and since the layer thickness of the structure element SE increases continuously, the edge R does not run perpendicular to the surface of the substrate S. Unlike with known structuring processes using etching techniques, wherein flanks of this type are generally undesirable, since, for example, they make it more difficult to laterally electrically insulate the structure, the shape of the edge R is not in this case a drawback. If insulation is actually required, sufficient space remains between the edge R and the material of the layer D1 to achieve good insulation. Furthermore, as will be explained in more detail, the inclined profile of the edge R may be an advantage if a further, thin layer is to be deposited on the structure element SE.

Figure 10:
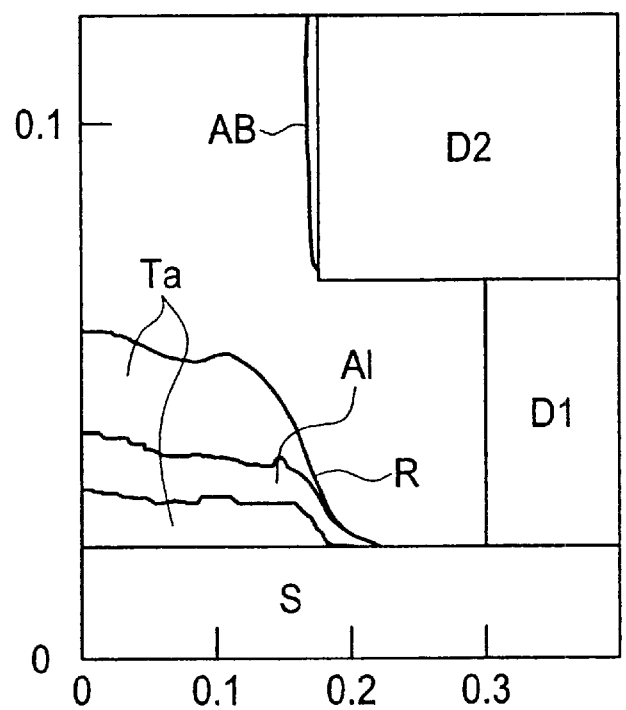
FIG. 10 is a diagram showing simulation results representing a cross-sectional profile of a micro-technical structure at its edge.
Figure 11:
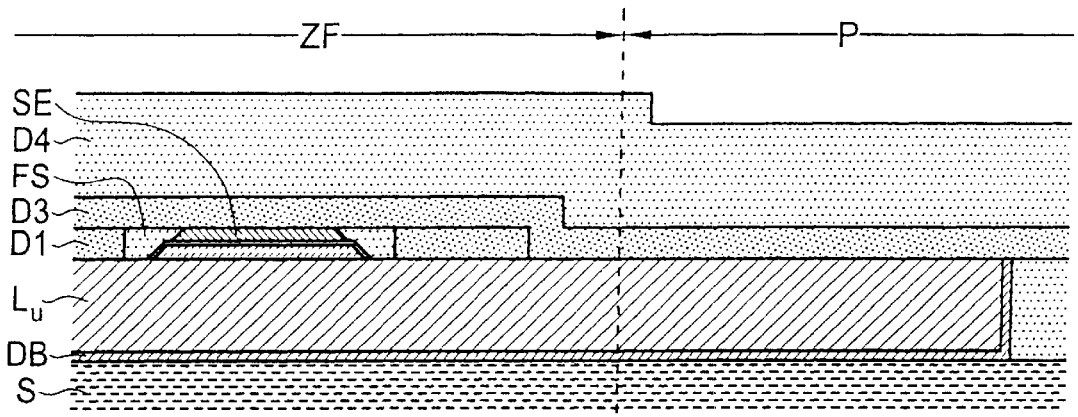
FIGS. 11A–11C are diagrammatic sections showing various stages of the integration of a TMR element in an MRAM memory component.
Figure 11:
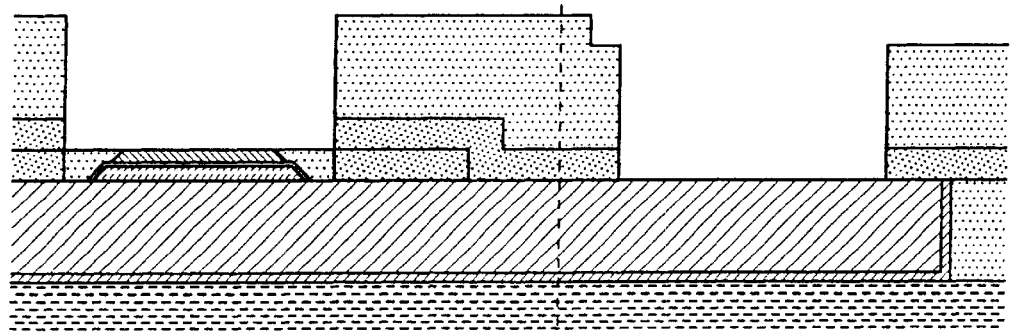
Figure 11:
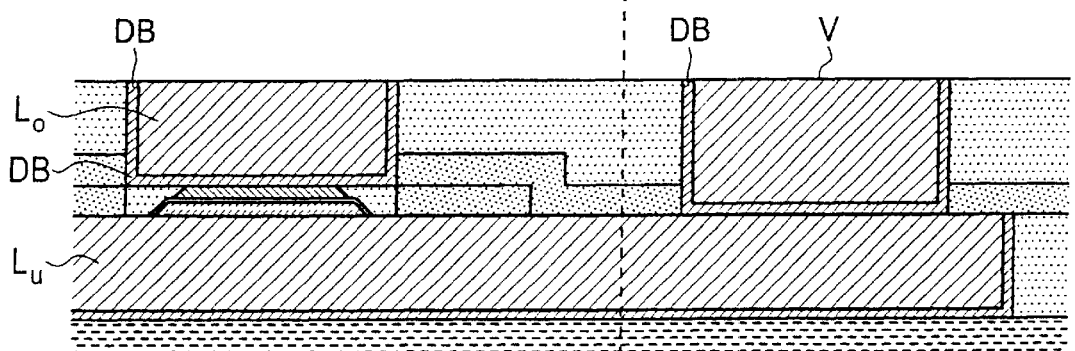

As shown in FIG. 10, the edge R, in cross section, is not rectilinear. FIG. 10 shows the result of a simulation of the deposition of a structure element which is composed of three layers. FIG. 10 illustrates part of the opening shown in FIG. in layers D1, D2. The measurement unit of the values plotted on the horizontal and vertical axes is, for example, μm (micron). The lower and upper layers of the structure elements consist of Ta and the interlayer consists of Al. FIG. 10 clearly shows the typical S-shaped cross-sectional profile of the edge R. Starting from a mean thickness for the thickness of the structure element, as is present, for example, at value 0.1 on the horizontal axis, the thickness initially decreases progressively, i.e. more quickly than in linear fashion, toward the edge, and then, after a reversal point has been reached, decreases digressively, i.e. more slowly than in linear fashion, toward the edge. The deposition AB (FIG. 3 and FIG. 10) leads to a reduction in the width of the opening in the layer D2 and therefore influences the shaping of the edge R. It can clearly be seen from FIG. 10 that the upper layer made from Ta scarcely has any material left at the far end of the edge R, on account of the closing gap between the structure element and the layer D2.

Figure 5:
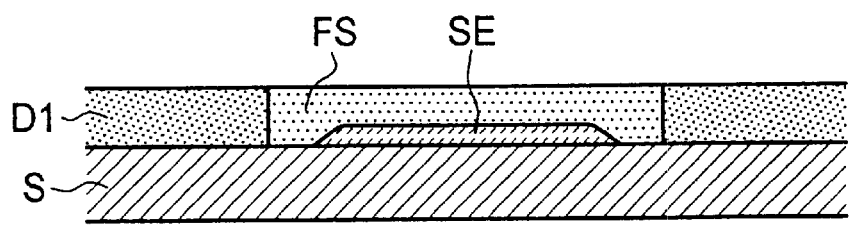

After the structure element SE has been fabricated, the opening in the layers D1, D2 is completely filled up with a filler material, so that a filler layer FS is formed. This takes place, for example, by means of a CVD (Chemical Vapor Deposition) process, wherein Sio2 or Si3N4 is deposited as filler material. Further options are to deposit spin-on glass or polyimide or to use other known filling processes. It is not necessary for the opening in the layers D1, D2 to be filled up without any voids. Preferably, however, the structure element SE is completely covered by the filler material. Preferably, after the structure illustrated in FIG. 4 has been achieved, the material of the filler layer FS and of the shadow mask SM is removed until regions wherein cavities could be present have been completely removed from the overall structure. This is done, for example, by CMP (Chemical Mechanical Polishing), until the material of the layer D2 has been completely removed (FIG. 5). Etching processes, such as plasma etching and wet-chemical etching, may also be used. The fact that the structure element SE is completely covered protects it from damage during this process and any further process steps. If, after partial removal of the filler material and of the material of the shadow mask SM, the opening in the shadow mask SM or in the layers D1, D2 is not yet sufficiently filled, this filling step can then be repeated under simplified conditions. The filling operation is made easier since the aspect ratio of the opening (ratio of the opening depth to the opening width) is considerably reduced. Advantageously, the material of the layer D2 and the filling layer FS down to below the level of the lower edge of the layer D2 is removed first, before renewed application of filler material is commenced.

Figure 6:
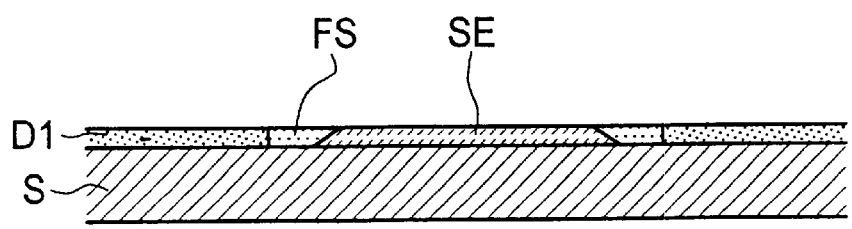
Figure 7:
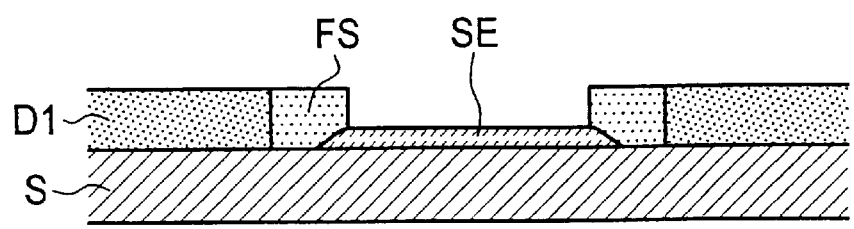

Particularly if the structure element SE is to be exposed on its surface, for example in order to make electrical contact therewith, further material of the shadow mask SM (the layer D1) and of the filler layer FS can be removed by CMP, until the surface of the structure element SE is exposed (FIG. 6). Alternatively, the surface of the structure element SE is exposed by means of a lithographic process and subsequent etching of a hole. The etching takes place, for example, by RIE (Reactive Ion Etching). The resulting structure is illustrated in FIG. 7.

Figure 8:
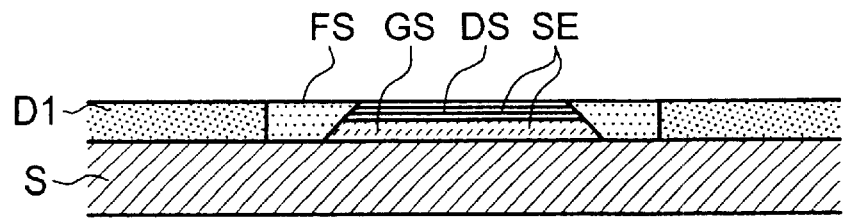
FIG. 8 is a section through an exemplary construction of a micro-technical structure.
Figure 9:
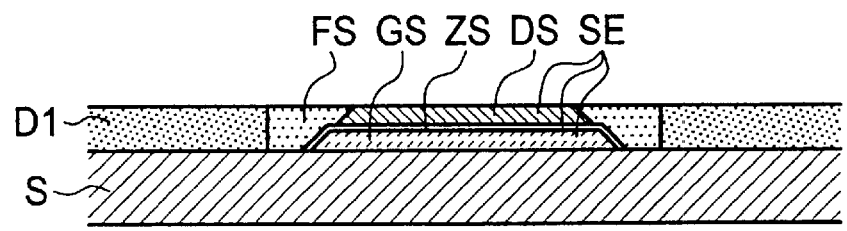
FIG. 9 is a section through an exemplary construction of a micro-technical structure.

FIG. 8 and FIG. 9 show different variants of the form of a structure element SE, as has been fabricated, for example, in the process steps shown in FIG. 1 to FIG. 7.

The structure element SE illustrated in FIG. 8 has a base layer GS with a substantially planar surface and a covering layer DS, likewise with a substantially planar surface. In this exemplary embodiment, the covering layer DS does not cover or does not completely cover the edge of the base layer GS. This structure can easily be achieved through the fact that the covering layer DS and the base layer GS can be applied in deposition processes with increasing directionality, or with increasingly marked nonuniform angular distribution. In this way, the material of the covering layer DS no longer reaches the edge region of the base layer GS.

The form of the structure element SE shown in FIG. 9 differs from that shown in FIG. 8 in that an additional interlayer ZS has been applied between the base layer GS and the covering layer DS. The interlayer ZS was applied in a deposition process with lower directionality or more uniform angular distribution, so that the edges of the base layer GS are completely covered by the material of the interlayer ZS. In this way it is possible, for example, to fabricate TMR or GMR elements for use in MRAM components. In TMR elements, the base layer (for example the hard magnetic layer) consists, for example of NiFeCo, the interlayer consists, for example, of $Al_2O_3$, and the covering layer DS consists, for example, of NiFe (for example the soft magnetic layer).

The manufacturing processes which have been described with reference to FIG. 1 to FIG. 7 are carried out, for example, as follows: the covering layer D1 is fabricated with a layer thickness of 50 nm using a PECVD (Plasma Enhanced Chemical Vapor Deposition) process. The material is, for example, $Si_3N_4$. The layer D2 consists, for example, of $SiO_2$, which has been applied with a layer thickness of 200 nm, likewise using a PECVD process. During the photolithography for generating the mask LM, holes with a width of approx. 350 nm were structured. The structuring of the layer D2 took place using an anisotropic RIE (Reactive Ion Etching) process with $CHF_3$, $CF_4$ and Ar etching gas. The isotropic etching of the layer D1 was effected by RIE, plasma etching and/or by CDE (Chemical Dry Etching). Suitable etching gases are $CF_4$ with $O_2$, $SF_6$ and $NF_3$. Alternatively, the hole may be made in the layer D1 by wet-chemical means in the presence of $H_3PO_4$ and at temperatures of 160 to 180° C.

The structure element SE is, for example, a TMR element which has been fabricated in the form explained with reference to FIG. 9 by adapting the directionality of the deposition process. The pressure and the basic nature of the deposition process were adapted accordingly. In a sputtering process, the target-substrate distance and the electrical voltage of the high frequency of a sputtering installation were changed. As has already been described, the degree of ionization of the gas in the process chamber is available as a further parameter (IMP process, as distinct from the standard PVD process). During the removal of the layer D1 outside the cell array ZF (FIG. 11a), an RIE process in the presence of CF4 with Ar or $SF_6$ with He was used. The lithography step required for this purpose is not critical with regard to resolution and overlay adjustment accuracy. The layer D3 (FIG. 11) was deposited using a PECVD process with a layer thickness of 50 nm from the material $Si_3N_4$. The layer D4 was likewise deposited in a PECVD process with a layer thickness of 400–600 nm as $SiO_2$. The structuring of the upper conductor tracks Lo (FIG. 11) in the cell array ZF and for the vias in the periphery P was achieved using a damascene process, i.e. by photolithography, RIE of the $SiO_2$ layer D4 selectively with respect to the layer D3 in the presence of $CHF_3$ and $CF_4$ and Ar, by RIE of the layer D3 selectively with respect to the uppermost layer material of the structure element and selectively with respect to the material of the filler layer FS in the presence of CF4 and Ar, by deposition of a TaN/Ta double layer with a total thickness of 15 nm as diffusion barrier DB in a sputtering process, and by deposition of Cu with a thickness of at least 200 nm by sputtering. Finally, the planar surface illustrated in FIG. 11C was achieved using a CMP process, by removing the Cu and the TaN or Ta selectively with respect to the SiO2 of the layer D4.

FIGS. 11A to 11C show cross sections through part of a cell array ZF with adjoining periphery region. By way of example, only one TMR cell of the cell array ZF is illustrated, namely the structure element SE which has been fabricated, for example, using a method as has been described with reference to FIG. 1 to FIG. 9. The cell array ZF is a field of memory cells, as in the structure element SE for a MRAM.

After the construction illustrated in FIG. 9 has been reached, firstly the layer D1 is removed in the region of the periphery P. Then, a third dielectric layer D3 is applied to the planar surface (in the cell array ZF) formed by the layer D1, the filler layer FS and the structure element SE or to the already existing lower conductor track $L_u$ for making electrical contact with the cell array or a part of the cell array. The lower conductor track $L_u$ is already embedded in a diffusion barrier DB which, in turn, is delimited at the bottom by the actual substrate S of the construction. Around the lower conductor track $L_u$, the diffusion barrier DB is laterally delimited by a dielectric material. Furthermore, the lower conductor track $L_u$ may also be delimited on its upper side by a diffusion barrier (not shown), which in this case is situated between the lower conductor track $L_u$ and the structure element SE. A fourth dielectric layer D4 is then applied to the third dielectric layer D3. The result is the overall construction shown in FIG. 11A.

Then, upper conductor tracks $L_o$ (in the cell array ZF) or vias V (in the periphery P) are fabricated using the damascene technique (inlay technique). For this purpose, first of all holes or trenches are produced through the layers D3, D4 to the structure elements SE or to the lower conductor track $L_u$ using a lithography process with subsequent etching (FIG. 11B). Then, firstly a diffusion barrier DB is introduced into the holes which have been generated, so that it completely covers the edge of the holes. The diffusion barrier DB is used in particular to prevent diffusion of the material of the conductor tracks $L_o$, V (for example Cu) which is yet to be introduced. Then, the elongate contact holes are filled with electrically conductive material. The final step is the planarization of the surface. This state is illustrated in FIG. 11C.

We claim:

1. A method of fabricating a micro-technical structure, which comprises the following steps:

providing a substrate with a surface;

forming a structured shadow mask on the surface of the substrate, and defining on the surface an uncovered surface region not covered by the mask and a shadow region shadowed but not covered by the mask; and depositing material through the mask in a directed deposition process and forming the micro-technical structure on the uncovered surface region of the substrate not covered by the mask.

2. The method according to claim 1, which comprises depositing materials to form a ferromagnetic structure for an MRAM.

3. The method according to claim 1, wherein the forming step comprises arranging and structuring the mask such that a first part of the mask covers a surface region of the substrate and a second part of the mask forms an overhang which is supported against the substrate by the first part and which defines the shadow region.

4. The method according to claim 3, wherein the forming step comprises initially depositing a first mask layer on the substrate and depositing a second mask layer on the first mask layer, and structuring the mask by removing the second mask layer and the first mask layer in defined regions and isotropically etching to remove additional material of the first mask layer between the second mask layer and the substrate.

5. The method according to claim 1, wherein the shadow region forms a continuous encircling margin around the uncovered surface region not shadowed by the mask on which the micro-technical structure is produced.

6. The method according to claim 1, which further comprises, after the step of forming the micro-technical structure, covering at least one of the shadow region of the substrate and a surface of the micro-technical structure with a filler material.

7. The method according to claim 6, which comprises forming a planar surface by removing part of the mask and part of the filler material.

8. The method according to claim 1, wherein the depositing step comprises forming the micro-technical structure by depositing a plurality of layers one above the other on the substrate.

9. The method according to claim 8, which comprises forming a layer on a previously applied layer of the structure, and fabricating the layers in deposition processes with different angular distributions of the material being deposited.

* * * * *